United States Patent [19]

Danby et al.

[11] Patent Number: 4,675,609
[45] Date of Patent: Jun. 23, 1987

[54] NUCLEAR MAGNETIC RESONANCE APPARATUS INCLUDING PERMANENT MAGNET CONFIGURATION

[75] Inventors: Gordon T. Danby; Raymond V. Damadian; Lawrence A. Minkoff, all of Melville, N.Y.

[73] Assignee: Fonar Corporation, Melville, N.Y.

[21] Appl. No.: 841,897

[22] Filed: Mar. 20, 1986

Related U.S. Application Data

[63] Continuation of Ser. No. 777,857, Sep. 18, 1985, abandoned, which is a continuation of Ser. No. 650,558, Sep. 13, 1984, abandoned, which is a continuation of Ser. No. 444,735, Nov. 26, 1982, abandoned.

[51] Int. Cl.⁴ .......................................... G01R 33/20
[52] U.S. Cl. .................................. 324/318; 324/319; 420/440; 335/306
[58] Field of Search ........ 324/300, 307, 309, 318–322; 335/209, 306

[56] References Cited

U.S. PATENT DOCUMENTS

| | | |
|---|---|---|
| 2,398,653 | 10/1942 | Linlor . |
| 2,894,199 | 7/1959 | Kirchner . |
| 2,930,966 | 3/1960 | Bell et al. . |
| 2,936,408 | 5/1960 | De Bennetot ........................ 335/306 |
| 2,952,803 | 9/1960 | Charles et al. ....................... 335/302 |
| 2,993,152 | 7/1961 | Pierce et al. . |
| 3,030,556 | 4/1962 | Watson ................................ 324/320 |
| 3,059,156 | 10/1962 | Moriya . |
| 3,168,686 | 2/1965 | King et al. . |
| 3,205,415 | 9/1965 | Seki et al. . |
| 3,564,398 | 2/1971 | Nelson ................................ 324/320 |
| 3,768,054 | 10/1973 | Neugebauer . |
| 3,789,832 | 2/1974 | Damadian . |
| 3,889,220 | 6/1975 | Spodig . |
| 3,891,475 | 6/1975 | Tomita ................................ 420/440 |
| 3,931,569 | 1/1976 | Hyde ................................... 324/316 |
| 4,048,555 | 9/1977 | Rupp, Jr. ............................ 324/320 |
| 4,093,912 | 6/1978 | Double et al. ...................... 324/320 |
| 4,122,386 | 10/1978 | Tomita ................................ 324/320 |
| 4,240,439 | 12/1980 | Abe et al. . |
| 4,254,778 | 3/1981 | Clow et al. ......................... 324/314 |
| 4,350,955 | 9/1982 | Jackson et al. . |
| 4,354,499 | 10/1982 | Damadian ........................... 128/653 |

OTHER PUBLICATIONS

"Field Focusing Nuclear Magnetic Resonance (FONAR): Visualization of a Tumor in a Live Animal", *Science*, Dec. 24, 1976.

"How Scientists are Detecting Cancer with Supermagnets", *Popular Science*, Mar. 1973.

"Whole-Body Nuclear Magnetic Resonance Scanning: N.M.R. Studies of Tumour Cells", *Submolecular Biology and Cancer*, Jun. 1979.

*Primary Examiner*—Michael J. Tokar
*Attorney, Agent, or Firm*—Lerner, David, Littenberg, Krumholz & Mentlik

[57] ABSTRACT

An apparatus for nuclear magnetic resonance scanning and imaging which employs a primary magnetic field, an rf field, and a detector for detecting a nuclear magnetic resonance signal, the primary magnetic field being produced by an assembly of relatively low energy flux magnetic material combined with an assembly of relatively high energy flux magnetic material. The magnetic flux of the relatively low energy flux magnetic material is concentrated in a magnetic flux conductor means which is in turn combined with the magnetic flux of the relatively high energy flux magnetic material and is concentrated at a pole piece.

83 Claims, 3 Drawing Figures

NUCLEAR MAGNETIC RESONANCE APPARATUS INCLUDING PERMANENT MAGNET CONFIGURATION

This is a continuation of application Ser. No. 777,857, filed Sept. 18, 1985, now abandoned, which application Ser. No. 777,857 is a continuation of application Ser. No. 650,558, filed Sept. 13, 1984, now abandoned, and which application Ser. No. 650,558 is in turn a continuation of application Ser. No. 444,735, filed Nov. 26, 1982, now abandoned.

BACKGROUND OF THE INVENTION

1. Field of the Invention

The present invention pertains to nuclear magnetic resonance apparatus for scanning and imaging, and more particularly to nuclear magnetic resonance apparatus which includes a primary magnetic field produced by a permanent magnet configuration, formed of a combination of relatively low energy flux magnetic material and relatively high energy flux magnetic material.

2. Description of the Prior Art

Nuclear magnetic resonance (NMR) apparatus has been employed only relatively recently for scanning and imaging of biological tissue as an aid in the practice of medicine. In 1974, U.S. Pat. No. 3,789,832, issued to the inventor of the present invention, for use of NMR scanning and imaging for medical applications. The primary components of NMR apparatus presently known for imaging of biological tissue, and more particularly whole body imaging of live biological tissue, include a primary magnetic field, an rf field, and a detector for detecting a nuclear magnetic resonance signal. The tissue to be imaged is subjected to the primary magnetic field and simultaneously an rf field of a particular frequency. Reradiated energy is detected by a detector and the signal therefrom is processed as desired to provide imaging.

In order to effectively image living biological tissue, a magnet must be constructed of sufficient size to accommodate the human form therebetween. In addition, the primary magnetic field generated by the magnet must be of sufficient strength and also must provide a substantially flat field over a relatively large area in order to be useful for its intended purpose.

NMR apparatus for such applications employ air core solenoids or resistive air core electromagnets. In order to obtain stronger magnetic fields a shift was later made to air core super conducting solenoids. These superconducting solenoids or electromagnets must be maintained by a vacuum system at approximately 1/1,000,000,000 of a vacuum and must be maintained at a temperature of approximately 4° above absolute zero or −269° C. The necessary vacuum systems are expensive, difficult to manufacture and maintain, and are extremely vulnerable. Cooling is accomplished by a combination of liquid helium and liquid nitrogen. These substances boil off in a vacuum and constantly must be replenished. Costs of $100,000 a year in liquid helium and nitrogen to keep an air core superconducting solenoid in operation are not uncommon. While vacuum systems and cooling systems have been designed which will provide functional NMR apparatus for use in imaging biological tissue, it is apparent that these devices are largely undesirable because of the precise atmosphere these superconducting electromagnets must be kept in and because of the cost of maintaining the proper atmospheric conditions.

Furthermore, magnetic lines of flux generated by air core solenoids cover an immense area and, since interference with these lines of magnetic flux can cause inappropriate NMR responses, elaborate sanctuaries uninvaded by materials or objects which would affect the magnetic field must be constructed.

Because of the relatively large flat working field of magnetic flux needed and because of the relatively high field strengths needed for NMR imaging of biological tissue, it has been heretofore thought impractical to employ a permanent magnet for such an application. Presently available low energy flux material, such as ceramic magnets, although inexpensive, do not produce sufficient field strength per unit volume so that a magnetic field produced by an aggregation of such magnets must be unreasonably large making this material impractical for use. Therefore, the use of low energy flux magnetic material is largely impractical since such magnets would have to be of an enormous size. The suggestion of using a permanent magnet in an NMR apparatus was made in the present inventor's U.S. Pat. No. 4,354,499. The present invention moves such a construction from the possible to the commercially practical.

High energy magnetic flux material is available for use and sufficient concentrations of magnetic field can be produced when these materials are aggregated but the cost of these materials is prohibitive and therefore their use has been ignored. Use of high energy magnetic flux materials such as rare earth magnets therefore is entirely impractical because of the cost involved in production and assembly of such a magnet.

The present invention overcomes the problems associated with the prior art by providing a permanent magnet configuration for use in nuclear magnetic resonance scanning and imaging apparatus for generation of a primary magnetic field which incorporates a combination of low energy flux magnetic material, high energy flux magnetic material, and flux conductors in a configuration which concentrates the magnetic flux over a region of sufficient area, sufficient uniformity and at a sufficient strength to produce a usable magnetic field for imaging of biological tissue and in particular for imaging of living whole body biological tissue. In addition, the area in which the permanent magnet configuration of the present invention can be employed is reduced, relative to air core type magnets, through magnetic shielding accomplished by placement of magnets of particular polarity at selected areas about the permanent magnet to reduce the magnetic radiation therefrom and to concentrate the magnetic field. Such a combination has not been heretofore known for use in generating a primary magnetic field for nuclear magnetic resonance scanning and imaging.

Generally, the use of a permanent magnet in an apparatus employing NMR principles is shown in U.S. Pat. No. 4,240,439 issued Abe et al on Dec. 23, 1980. The apparatus of Abe teaches a probe for observing NMR phenomenon for small surface areas of a living body or areas disposed therein by transcutaneous insertion of the probe. The use of a permanent magnet configuration which generates a field sufficient to permit whole body scanning is not shown or suggested.

Similarly, the use of permanent magnets in nonbiological NMR apparatus is shown in U.S. Pat. Nos. 2,894,199 issued to Kirchner on July 17, 1959 and 4,350,955 issued to Jackson on Sept. 21, 1982. However, generation of a magnetic field of the type produced by the present invention through the use of a combination of high and low magnetic flux magnets, and flux conductors in combination is not shown or suggested.

Aggregation of magnets is known as shown in U.S. Pat. Nos. 3,059,156 to Moriya on Oct. 16, 1962 and 3,889,220 issued to Spodig on June 10. 1975, however neither of these references shows or suggests a manner for combining magnets in a form suitable for producing a magnetic field of sufficient strength and of sufficient flatness for use in imaging of biological tissue, and more particularly, to whole body imaging.

Furthermore, the shielding of permanent magnets to concentrate the magnetic field generated by a permanent magnet in an NMR device is not shown in the prior art. While teaching for shielding of magnets is shown in U.S. Pat. Nos. 2,398,653 issued to Linlor on Apr. 16, 1946; 2,993,152 issued to L. Pierce on July 18, 1961; 3,768,054 issued to Neugebauer on Oct. 23, 1973; 3,168,686 issued to King on Feb. 2, 1965; and 3,205,415 issued to Seki on Sept. 7, 1965, none of these references show or suggest the use of such shielding for NMR apparatus and none show the use of shielding on a magnet which physically even remotely approaches the size and complexity magnet necessary for whole body NMR imaging.

Maintaining a flat field is important in NMR apparatus. A technique for accomplishing this is shown in U.S. Pat. No. 2,930,966 issued to Bell on Mar. 29, 1960.

SUMMARY OF THE INVENTION

Therefore, a primary object of the present invention is to provide nuclear magnetic resonance scanning and imaging apparatus which employs a permanent magnet to produce the primary magnetic field thereof.

A further object of the present invention is to provide a permanent magnet for use in conjunction with nuclear magnetic resonance scanning and imaging apparatus wherein a sufficiently strong magnetic field is produced to permit scanning and imaging of selected portions of a human body.

A still further object of the present invention is to provide a permanent magnet for use in nuclear magnetic resonance scanning and imaging apparatus wherein the magnetic field produced is of adequate uniformity.

Another still further object of the present invention is to provide nuclear magnetic resonance scanning and imaging apparatus which includes a permanent magnet for generating the primary magnetic field thereof, the permanent magnet employing a combination of low energy magnetic flux material, high energy magnetic flux material, and selected flux conductors.

An additional object of the present invention is to provide nuclear magnetic resonance scanning and imaging apparatus which employs a permanent magnet that can be constructed in a manner wherein the cost of construction is no greater than the cost for producing a supercooled electromagnet structure.

A still additional object of the present invention is to provide nuclear magnetic resonance scanning and imaging apparatus which includes means for stabilizing the magnetic field thereof regardless of thermal atmospheric changes.

A still further and additional object of the present invention is to provide a permanent magnet construction for use in nuclear magnetic resonance scanning and imaging apparatus which is simple in design, reliable in construction and efficient in operation.

These objects as well as further objects and advantages in the present invention will become readily apparent after reading the ensuing description of a nonlimiting illustrative embodiment and viewing the accompanying drawing.

An apparatus for nuclear magnetic resonance scanning and imaging which employs a primary magnetic field, an rf field, and a detector for detecting a nuclear magnetic resonance signal the improvement in accordance with the principles of the present invention for producing the primary magnetic field which comprises, in a broad sense, a magnetically conductive frame forming an opening therein; an assembly of relatively low energy flux magnetic material disposed within the opening adjacent to the frame, magnetic flux conductor means disposed adjacent to the assembly of relatively low energy flux magnetic material; the magnetic flux conductor means and the frame sandwiching therebetween the assembly of relatively low energy flux magnetic material; an assembly of relatively high energy flux magnetic material disposed within the opening adjacent to the magnetic flux conductor means, the magnetic flux conductor means being disposed between the assembly of the low energy flux magnetic material and the assembly of high energy flux magntic material, the assembly of relatively high energy flux magnetic material being of a small volume relative to the assembly of relatively low energy flux magnetic material; and pole piece means being disposed adjacent to the assembly of relatively high energy flux magnetic material, the pole piece means and the magnetic flux conductor means sandwiching therebetween the assembly of relatively high energy flux magnetic material, the primary magnetic field being formed between the pole piece means and the magnetically conductive frame.

More specifically, the preferred embodiment of the present invention is an apparatus for nuclear magnetic resonance scanning and imaging which employs a primary magnetic field, an rf field and a detector for detecting a nuclear magnetic resonance, the improvement according to the principles of the present invention for producing the primary magnetic field comprising a magnetically conductive frame forming an opening therein, the opening being formed by opposed first and second spaced apart surfaces of the frame; a first assembly of relatively low energy flux magnetic material disposed within the opening adjacent to the first surface of the frame; first magnetic flux conductor means disposed adjacent to the first assembly of relatively low energy flux magnetic material, the first magnetic flux conductor means and the first surface of the frame sandwiching therebetween the first assembly of relatively low energy flux magnetic material; a first assembly of relatively high energy flux magnetic material disposed within the opening adjacent to the first magnetic flux conductor means, the first magnetic flux conductor means being disposed between the first assembly of low energy flux magnetic material and the first assembly of high energy flux magnetic material, the first assembly of relatively high energy flux magnetic material being of smaller volume than the first assembly of relatively low energy flux magnetic material; first pole piece means being disposed adjacent to the first assembly of relatively high energy flux magnetic material, the first pole piece means and the first magnetic flux conductor means sandwiching therebetween the first assembly of relatively high energy flux magnetic material; a second assembly of relatively low energy flux magnetic material disposed within the opening adjacent to the second surface of the frame; second magnetic flux conductor means disposed adjacent to second assembly of relatively low energy flux magnetic material, the second magnetic flux conductor means and the second surface of the frame sandwiching therebetween the second assembly of relatively low energy flux magnetic material; a second assembly of relatively high energy flux magnetic material disposed within the opening adjacent to the second magnetic flux conductor means, the second magnetic flux conductor means being disposed between the second assembly of low energy flux magnetic material and the second assembly of high energy flux magnetic material, the second assembly of relatively high energy flux magnetic material being of a smaller volume than the second assembly of relatively low energy flux magnetic material; and second pole piece means disposed adjacent to the second assembly of relatively high energy flux magnetic material, the second pole piece means and the second magnetic flux conductor means sandwiching therebetween the second assembly of relatively high energy flux magnetic material, the first and second pole pieces being spaced apart and forming therebetween the primary magnetic field.

BRIEF DESCRIPTION OF THE DRAWING

In order that the present invention may be more fully understood it will now be described, by way of example, with reference to the accompanying drawing in which.

DESCRIPTION OF THE PREFERRED EMBODIMENT

Figure 1:
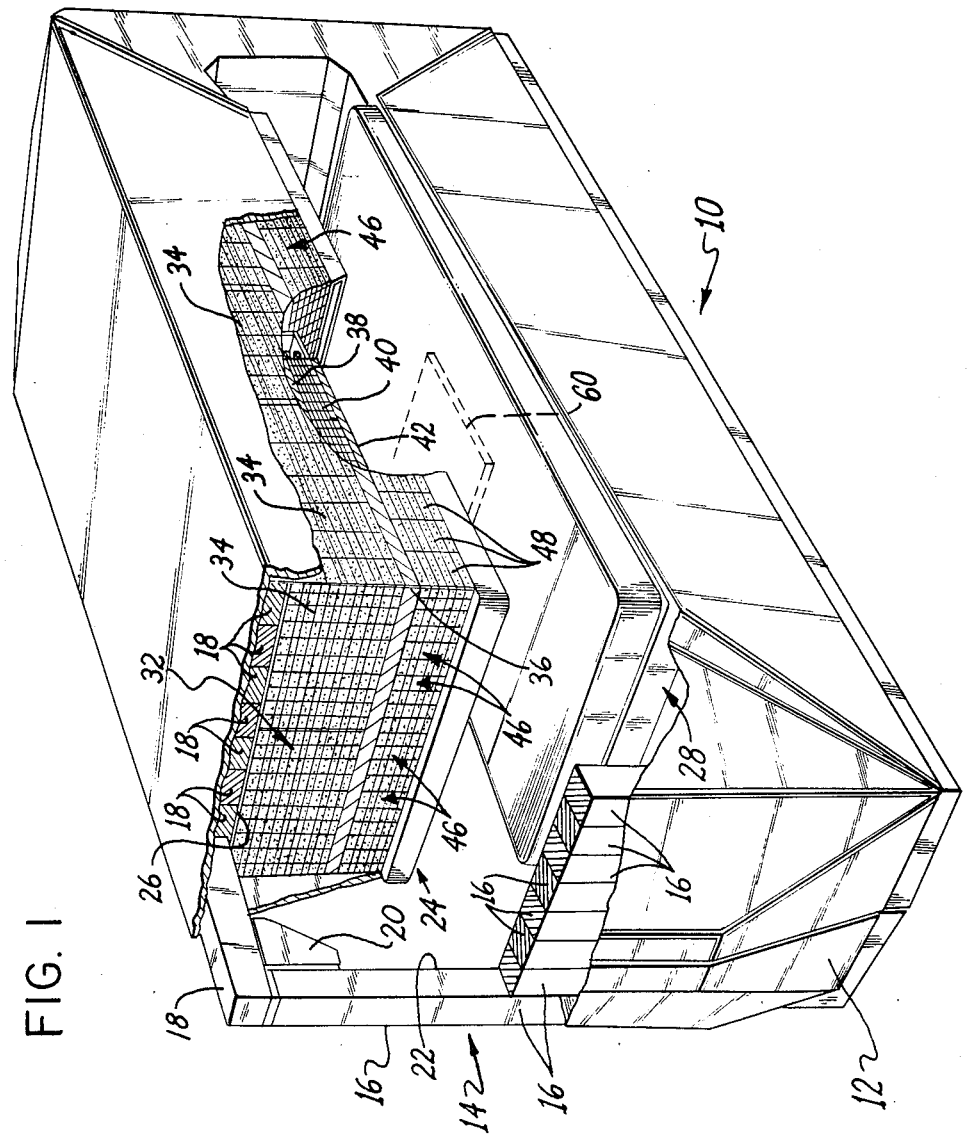
FIG. 1 a partially broken away perspective view of NMR apparatus showing the permanent magnet configuration of the present invention.

Referring now to the figures, and more particularly to FIG. 1 thereof there is illustrated therein a permanent magnet construction 10 of nuclear magnetic resonance scanning and imaging apparatus. The permanent magnet construction 10 includes a housing 12 which encloses the components of the magnet 10. The supporting structure of the magnet 10 is a frame 14 constructed of a plurality of magnetizable steel or iron girders 16 and 18. The steel girders 16 and 18 are assembled with the aid of corner pieces 20 to form a plurality of substantially rectangular structures which are joined together side by side to form the frame 14. The frame 14 defines an opening 22 formed by the girders 16 and 18.

Although the girders 16 and 18 are illustrated in a particular configuration, it is to be understood that other assemblies or structures can be employed to fabricate the desired frame structure and, for instance, the structure could be constructed of four rectangular plates or other similar configurations to produce a frame having an opening therein for the mounting of the balance of the components of the magnet construction 10.

Figure 2:
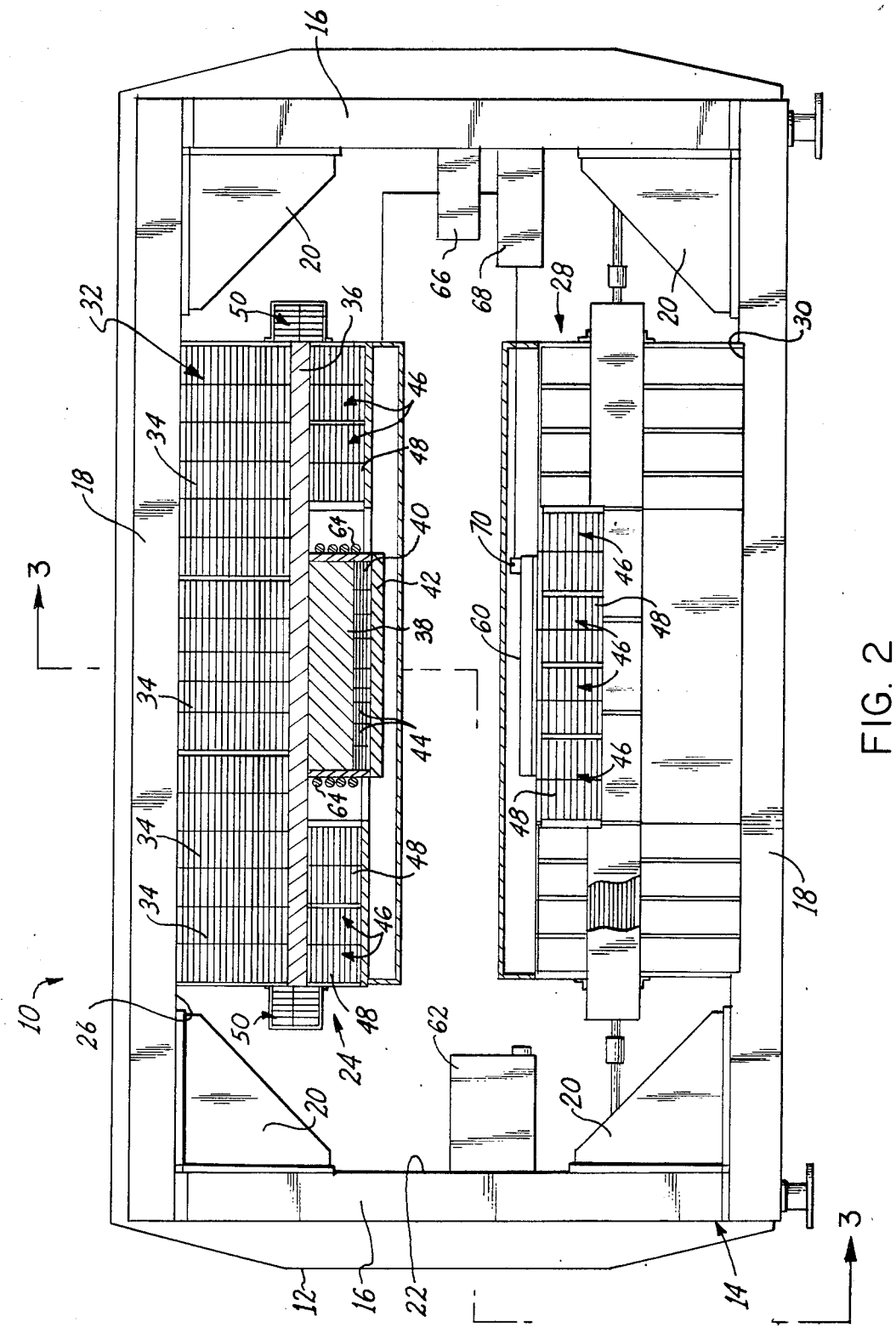
FIG. 2 is a cross sectional view of the apparatus of FIG. 1.

With reference to FIGS. 1, 2, and the permanent magnet construction 10 can be seen to include a first magnet structure 24 disposed adjacent to an interior first surface 26 of the frame 14 within the opening 22 thereof and a second magnet structure 28 disposed adjacent to an interior second surface 30 of the frame 14.

Figure 3:
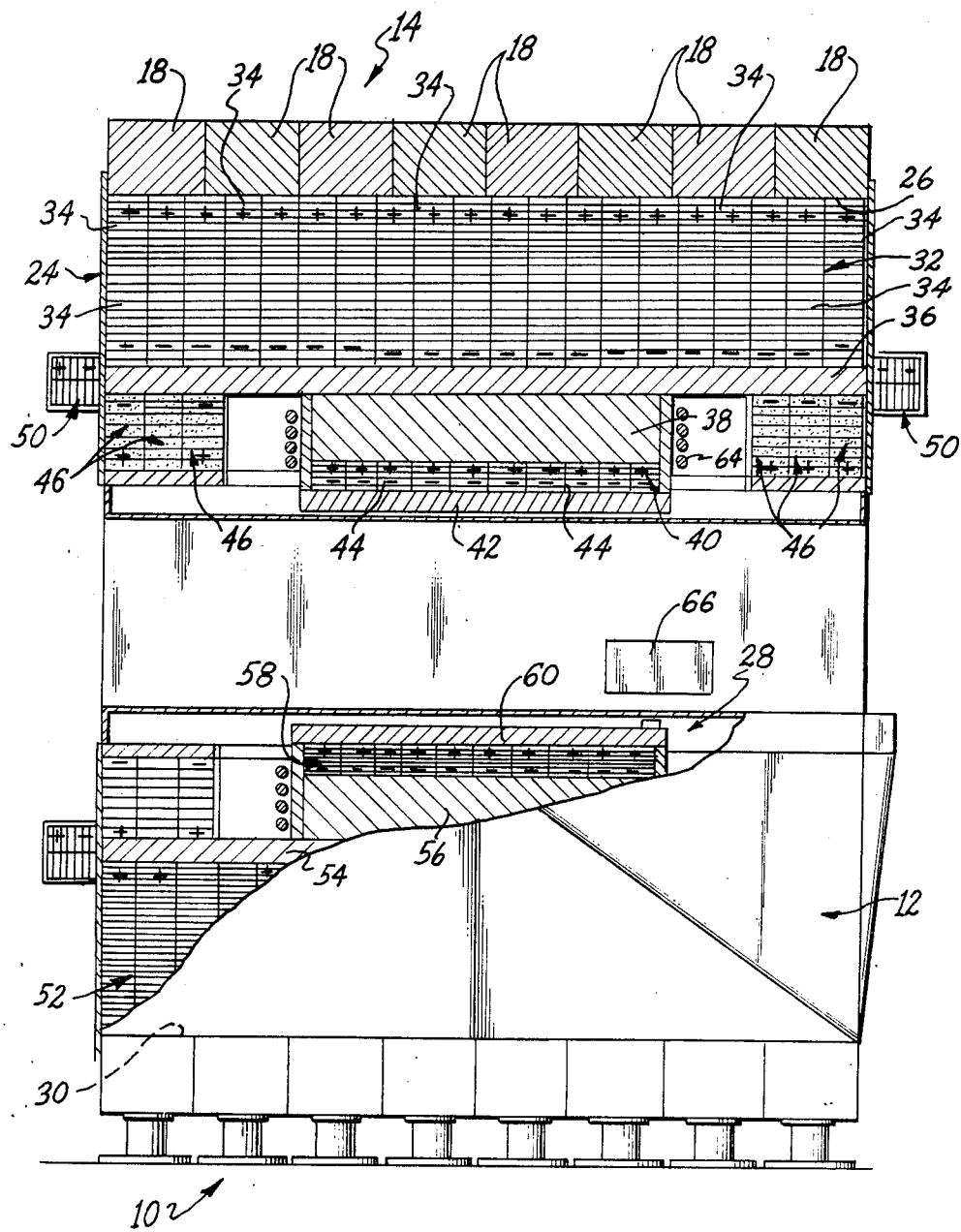
FIG. 3 is a partially broken away cross sectional view taken along the lines 3—3 of FIG. 2.

Further shown in FIGS. 1, 2, and as best illustrated in FIG. 3, the first magnet structure 24 and the second magnet structure 28 are essentially identical as will be hereinafter described. The first magnet structure 24 includes an assembly 32 of relatively low energy flux magnetic material which comprises a plurality of low energy flux magnets such as ceramic magnets 34 or the like. The ceramic magnets 34 are arranged in rows and columns in a stacked matrix configuration, with appropriate polarity orientation so that the magnetic strength thereof is aggregated.

A plate 36 which serves as means for conducting magnetic flux is disposed adjacent to the first assembly 32 of relatively low energy flux magnetic material such that magnetic material thereof is sandwiched between the plate 36 and the first surface 26 of frame 14 The plate 36 is magnetically conductive and can be constructed of magnetic steel or the like. The plate 36 serves to concentrate the magnetic flux of the first assembly 32 of relatively low energy flux magnetic material therein. This flux is conducted through the plate 36 and concentrated into an auxiliary conducting plate 38 in contact with a first assembly 40 of relatively high energy flux magnetic material. The plates 36 and 38 can be of integral or unitary construction. The first assembly 40 of relatively high energy flux magnetic material is bounded on one side thereof by the auxiliary conducting plate 38 and on the other side by a first pole piece 42.

The first assembly 40 of relatively high energy flux magnetic material comprises a plurality of rare earth magnets 44 which are arranged in rows and columns in a stacked matrix configuration. Any suitable rare earth material can be employed and, for this particular application, rare earth magnet bricks of a material called MISH metal has been employed.

The ceramic magnets 34 and the rare earth magnets 44 are each formed of bricks approximately four inches by six inches by one inch. In order to mount the magnets of the assemblies of relatively high and low energy flux magnetic material, suitable nonmagnetic material such as aluminum can be employed. The polarity of each of the rare earth magnets 44 is observed in assembling the first assembly 40 of relatively high energy flux magnetic material.

of relatively low energy flux magne material and the first assembly 40 of relatively high energy flux magnetic. By virtue of the combination of the first assembly 32 of relatively low energy flux magnetic material and the first assembly 40 of relatively high energy flux magnetic material with the plates 36 and 38, the magnetic flux of both the assemblies 32 and 40 is concentrated at the pole piece 42.

In order to reduce leakage from the plate 36 and the auxiliary conducting plate 38, stacks 46 of ceramic magnets 48, with their polarity reversed relative to the first assembly 32 of relatively low energy flux magnetic material, are provided.

The polarity of the magnets in the assemblies 32 and 40 and in the stacks 46 is such that the upper face of each of the bricks is one pole of the magnet and the lower face of each of the bricks is another pole of the magnet. The bricks are stacked in a manner known in the art, such that the negative pole of one brick contacts the positive pole of the next brick in each stack. When the bricks are of reverse polarity, each stack is still in the same configuration, but the upper and lowermost poles of the stacks are reversed relative to the other stacks. For purposes of illustration, plus and minus signs have been placed at the top and bottom of each stack of magnets illustrated in FIG. 3 of the drawing to show the relationships of the poles thereof. In order to further reduce leakage of magnetic flux from the plate 36, a band 50 of stacked ceramic magnets is disposed about the peripheral edge thereof.

The volume of the first assembly 32 of 35 relatively low energy flux magnetic material is much greater than the volume of the first assembly 40 of relatively high energy flux magnetic material. Essentially, the assembly 30 provides a base level magnetic strength and the assembly 40 adds to that base level in a cost effective manner.

The second magnet structure 28 is virtually identical to the first magnet structure 24 and includes a first assembly 52 of relatively low energy flux magnetic material, a plate 54, an auxiliary conducting plate 56, a second assembly 58 of relatively high energy flux magnetic material, and a second pole piece 60. The plate 54 sandwiches the second assembly 52 of relatively low energy flux magnetic material between itself and the second surface 30 of the frame 14. The auxiliary conducting plate 56 is mounted adjacent to the plate 54 and the second assembly 58 of relatively high energy flux magnetic material is sandwiched between the auxiliary conducting plate 56 and the second pole piece 60. Shielding bricks similar to stacks 46 and band 50 of the first magnet structure 24 are also provided.

The magnetic flux developed between the first and second pole pieces 42 and 60 in an apparatus constructed in accordance with the principles of the present invention is approximately 3,000 gauss and is stable to one part in $10^{-4}$ over a radius of eight inches. Of course, if a desired flatness is not acheived, for instance, a flatness better than one part in $10^{-3}$ over a ten inch diameter, through the configuration of the magnets alone, it is to be understood that electromagnetic shim coils can be used to further flatten the field by placement of these coils over the pole pieces. The hereinbefore discussed combination of relatively low energy flux magnetic material and relatively high energy flux magnetic material permits the achievement of the noted magnetic strength and flatness at an economically feasible cost and in an area the size of which is practical.

Of course, in addition to the provision of a primary magnetic field between the first and second pole pieces 42 and 60, an rf field source and a detector for detecting nuclear magnetic resonance must also be provided. However, since these are well known in the art, they have not been illustrated.

When a body is to be imaged, it is moved into the magnetic field created between the first pole piece 42 and the second pole piece 60 by any suitable means well known in the art. When the permanent magnet construction 10 is employed in an NMR apparatus it has been found to be desirable to work at a frequency of 12 MHz. It is known that permanent magnets drift as a result of changes in temperature. The drift of the magnet construction 10 has been held to less than 10 Hz per hour by temperature regulation of the interior of the housing 12 This temperature regulation is accomplished by a heater 62, of the forced air type, disposed within the housing 12. The heater senses the temperature via a thermistor disposed in one of the bricks, not illustrated, and circulates heated air within the housing to maintain a desired temperature. For instance, a temperature of 77° F. has been employed.

In addition to maintaining the temperature within the housing 12, further stability has been achieved by wrapping of coils around the rare earth brick magnets and inducing current in these coils. For instance, a coil 64 is illustrated disposed around the first assembly of relatively high energy flux magnetic material 40. The coil 64 is coupled to a power supply 66 which in turn is controlled by a control means 68. Control means 68 monitors NMR sample 70 within the primary magnetic field created by the first and second pole pieces 42 and 60. The frequency of the NMR sample is determined by the control means 68. Depending upon shift in this frequency, the power supply 66 is activated to induce current in the coil 64. As a result, the coil 64 creates a supplementary magnetic field which can be added or subtracted to the primary magnetic field depending upon the polarity of the current in the coil, a factor controlled by the control means 68. The control means preferably employs a relatively standard microprocessor to process data and issue control instructions, such instrumentation control being well known to those of ordinary skill in the art.

It should be understood that although a particular permanent magnet configuration has been illustrated, that such a permanent magnet configuration can be combined with an electromagnet configuration to achieve a desired field strength within the principles and scope of the invention.

It should further be understood that various changes in the details, materials, arrangements of parts, and operational conditions which have been herein described and illustrated in order to explain the nature of the invention may be made by those skilled in the art within the principles and scope of the invention.

Having thus set forth the nature of the invention, what is claimed is:

1. In an apparatus for nuclear magnetic resonance scanning and imaging which employs a primary magnetic field, an rf field and a detector for detecting a nuclear magnetic resonance signal, the improvement for producing the primary magnetic field comprising:

a magnetically conductive frame forming an opening therein;

an assembly of relatively low energy flux magnetic material disposed within said opening adjacent to said frame;

magnetic flux conductor means disposed adjacent to said assembly of relatively low energy flux magnetic material, said magnetic flux conductor means and said frame sandwiching therebetween said assembly of relatively low energy flux magnetic material;

an assembly of relatively high energy flux magnetic material disposed within said opening adjacent to said magnetic flux conductor means, said magnetic flux conductor means being disposed between said assembly of low energy flux magnetic material and said assembly of high energy flux magnetic material, said assembly of relatively high energy flux magnetic material being of a smaller volume than said assembly of relatively low energy flux magnetic material; and pole piece means being disposed adjacent to said assembly of relatively high energy flux magnetic material, said pole piece means and said magnetic flux conductor means sandwiching therebetween said assembly of relatively high energy flux magnetic material, said primary magnetic field being formed between said pole piece means and said magnetically conductive frame.

2. An apparatus for nuclear magnetic resonance scanning and imaging in accordance with claim 1, further comprising magnetic flux shielding means disposed adjacent to said magnetic flux conductor means to shield selected surfaces thereof not disposed between said assembly of relatively low energy flux magnetic material and said assembly of relatively high energy flux magnetic material.

3. An apparatus for nuclear magnetic resonance scanning and imaging in accordance with claim 1, further comprising means for regulating the temperature of said assembly of relatively low energy flux magnetic material and said assembly of relatively high energy flux magnetic material.

4. An apparatus for nuclear magnetic resonance scanninq and imaging in accordance with claim 1, further comprising electromagnetic means disposed within said opening adjacent to said assembly of relatively high energy flux magnetic material for modifying said primary magnetic field.

5. In an apparatus for nuclear magnetic resonance scanning and imaging which employs a primary magnetic field, an rf field and a detector for detecting a nuclear magnetic resonance, the improvement for producing the primary magnetic field comprising:

a magnetically conductive frame forming an opening therein, said opening being formed by opposed first and second spaced apart surfaces of said frame;

a first assembly of relatively low energy flux magnetic material disposed within said opening adjacent to said first surface of said frame;

first magnetic flux conductor means disposed adjacent to first assembly of relatively low energy flux magnetic material, said first magnetic flux conductor means and said first surface of said frame sandwiching therebetween said first assembly of relatively low energy flux magnetic material;

a first assembly of relatively high energy flux magnetic material disposed within said opening adjacent to said first magnetic flux conductor means, said first magnetic flux conductor means being disposed between said first assembly of low energy flux magnetic material and said first assembly of high energy flux magnetic material, said first assembly of relatively high energy flux magnetic material being of a smaller volume than said first assembly of relatively low energy flux magnetic material;

first pole piece means being disposed adjacent to said first assembly of relatively high energy flux magnetic material, said first pole piece means and said first magnetic flux conductor means sandwiching therebetween said first assembly of relatively high energy flux magnetic material;

a second assembly of relatively low energy flux magnetic material disposed within said opening adjacent to said second surface of said frame;

second magnetic flux conductor means disposed adjacent to said second assembly of relatively low energy flux magnetic material, said second magnetic flux conductor means and said second surface of said frame sandwiching therebetween said second assembly of relatively low energy flux magnetic material;

a second assembly of relatively high energy flux magnetic material disposed within said opening adjacent to said second magnetic flux conductor means, said second magnetic flux conductor means being disposed between said second assembly of low energy flux magnetic material and said second assembly of high energy flux magnetic material, said second assembly of relatively high energy flux magnetic material being of a smaller volume than said second assembly of relatively low energy flux magnetic material; and second pole piece means being disposed adjacent to said second assembly of relatively high energy flux magnetic material, said second pole piece means and said second magnetic flux conductor means sandwiching therebetween said second assembly of relatively high energy flux magnetic material, said first and said second pole pieces being spaced apart and forming therebetween said primary magnetic field.

6. An apparatus for nuclear magnetic resonance scanning and imaging in accordance with claim 5, further comprising first and second magnetic flux shielding means disposed, respectively, adjacent to said first and said second magnetic flux conductor means, said first magnetic flux shielding means for shielding selected surfaces of said first magnetic flux conductor means not disposed between said first assembly of relatively low energy flux magnetic material and said first assembly of relatively high energy flux magnetic material, said second magnetic flux shielding means for shielding selected surface of said second magnetic flux conductor means not disposed between said second assembly of relatively low energy flux magnetic material and said second assembly of relatively high energy flux magnetic material.

7. An apparatus for nuclear magnetic resonance scanning and imaging in accordance with claim 6, wherein said magnetic flux shielding means comprises a plurality of magnets arranged to effect said shielding.

8. An apparatus for nuclear magnetic resonance scanning and imaging in accordance with claim 5, wherein said first and second assemblies of relatively low energy flux magnetic material each comprise a plurality of relatively low energy flux magnetic bricks arranged in matrix fashion.

9. An apparatus for nuclear magnetic resonance scanning and imaging in accordance with claim 8, wherein said bricks are of the ceramic magnet type.

10. An apparatus for nuclear magnetic resonance scanning and imaging in accordance with claim 5, wherein said first and said second assemblies of relatively high energy flux magnetic material each comprise a plurality of relatively high energy flux magnetic bricks arranged in matrix fashion.

11. An apparatus for nuclear magnetic resonance scanning and imaging in accordance with claim 10, wherein said bricks are of the rare earth magnet type.

12. An apparatus for nuclear magnetic resonance scanning and imaging in accordance with claim 5, further comprising temperature regulation means for regulating the temperature of said first and said second assemblies of relatively low energy flux magnetic material, said first and said second assemblies of relatively high energy flux magnetic material, said first and..said second pole piece means and said magnetically conductive frame.

13. An apparatus for nuclear magnetic resonance scanning and imaging in accordance with claim 12, wherein said temperature regulation means comprises a housing for enclosing said first and said second assemblies of relatively low energy flux magnetic material, said first and said second assemblies of relatively high energy flux magnetic material, said first and said second pole piece means and said magnetically conductive frame; and heater means for selectively heating the interior of said housing to maintain therein a preselected temperature.

14. An apparatus for nuclear magnetic resonance scanning and imaging in accordance with claim 13, wherein said heater means is of the forced hot air type.

15. An apparatus for nuclear magnetic resonance scanning and imaging in accordance with claim 5, further comprising electromagnetic means disposed within said opening to modify said primary magnetic field.

16. An apparatus for nuclear magnetic resonance scanning and imaging in accordance with claim 15, wherein said electromagnetic means comprises at least one coil of wire disposed proximate to said first and said second assemblies of relatively high energy flux magnetic material; and power supply means for selectively supplying current to said coil to induce therein a corrective magnetic field which interacts with said primary magnetic field.

17. An apparatus for nuclear magnetic resonance scanning and imaging in accordance with claim 16, wherein said electromagnetic means is employed to enhance stability of said primary magnetic field, said electromagnetic means further comprising a nuclear magnetic resonance sample disposed in said primary field, the frequency of the nuclear magnetic resonance of said sample shifting with variations in said primary magnetic field, said electromagnetic means further comprising frequency detection means and control means coupled thereto, said control means being coupled to said power supply means, said shift in frequency controlling the magnitude and polarity of said current supplied to said coil.

18. Apparatus for producing a primary magnetic field comprising:
a support formed of magnetically soft material;
an assembly of relatively low energy magnetic material disposed adjacent to said support and extending therefrom;
flux concentrator means dIsposed adjacent to said assembly of relatively low energy magnetic materia, said flux concentrator means and said support sandwiching said assembly of relatively low energy magnetic material therebetween;
an assembly of relatively high energy magnetic material disposed adjacent to at least a portion of said flux concentrator means, said assembly of relatively high energy magnetic material exhibiting a smaller volume than said assembly of relatively low energy magnetic material, said portion of said flux concentrator means being disposed between said assembly of relatively low energy magnetic material and said assembly of relatively high energy magnetic material; and
pole piece means disposed adjacent to said assembly of relatively high energy magnetic material, said pole piece means and said portion of said flux concentrator means having said assembly of relatively high energy magnetic material disposed therebetween.

19. The apparatus according to claim 18 addtiionally comprising means for completing a flux path for said primary magnetic field between said pole piece means and said support.

20. Apparatus for producing a primary magnetic field, comprising:
an assembly of relatively low energy magnetic material;
flux concentrator means disposed adjacent to said assembly of relatively low energy magnetic material;
an assembly of relatively high energy magnetic material disposed adjaccnt to at least a portion of said flux concentrator means; said potrion of said flux concentrator means being disposed between said assembly of relatively low energy magnetic material and said assembly of relatively high energy magnetic material, said assembly of relatively high energy magnetic material having a lesser volume than said assembly of relatively low energy magnetic material; and
pole piece means disposed adjacent to said assembly of relatively high energy magnetic material, said pole piece means and said portion of said flux concentrator means having said assembly of relatively high energy magnetic material disposed therebetween.

21. The apparatus according to claim 20 additionally comprising means for completing a flux path through an air gap for said primary magnetic field from said pole piece means to said assembly of relatively low energy magnetic material.

22. Apparatus for producing a primary magnetic field comprising
an assembly of relatively low energy magnetic material having sufficieni volume to establish a predetermined base level energy !or said primary magnetic field;
concentrator means disposed adjacent to said assembly of relatively low energy magnetic material for concentrating flux from said assembly of relatively low energy magnetic material therethrough;
an assembly of relatively high energy magnetic material adjacent to at least a portion of said concentrator means, said assembly of relaitvely high energy magnetic material having a volume which is less than the volume of said assembly of low energy magnetic material and is sufficient to substantially increase the energy for said primary magnetic field from said predetermined base level; and
pole piece means disposed adjacent to said assembly of relatively high energy magnetic material, said pole piece means and said portion of said concentrator means having said high energy magnetic material disposed therebetween.

23. The apparatus according to claim 22 additionally comprising means for completing a flux path through an air gap for said primary magnetic field from said pole piece means to said assembly of relatively low energy magnetic material.

24. Apparatus for producing a primary magnetic field comprising:
first and second, òppositely poled assemblies of relatively low energy magnetic material;
first and second flux concentrator means disposed, respectively, adjacent to said first and second assemblies of relatively low energy magnetic material;
first and second, oppositely poled assemblies of relatively high energy magnetic material disposed, respectively adjacent to at least a portion of said first and second flux concentrator means; said portions of said first and second flux concentrator being disposed respectively between said first and second assemblies of relatively low energy magnetic material and said first and second assemblies of relatively high energy magnetic material, each of said first and second assemblies of relatively high energy magnetic material having a lesser volume than said first and second assemblies of relatively low energy material; and first and second pole piece means, respectively, disposed adjacent to said first and second assemblies of relatively high energy magnetic material for establishing said primary magnetic field therebetween, said first and second pole piece means and said portions of said first and second flux concentrator means respectively having said first and second assemblies of relatively high energy magnetic material disposed, respectively, therebetween.

25. The apparatus according to claim 24 additionally comprising means for completing a flux path between said first and second assemblies of relatively low energy magnetic material.

26. The apparatus according to claim 25 wherein said means for completing a flux path takes the form of a magnetically soft support upon which each of said first and second, oppositely poled assemblies of relatively low energy magnetic material is mounted.

27. NMR scanner apparatus comprising:
an assembly of magnetic material formed of a substantial number of magnetic elements arranged in columns and rows of like polarity, said assembly of magnetic material defining a volume exhibiting sufficient coercivity to induce polarization in living tissue;

a support formed of magnetically soft material, said support providing a flux path for said assembly of magnetic material and a platform from which said assembly of magnetic material extends; and flux concentrator means disposed adjacent to a surface of said assembly of magnetic material for concentrating flux generated by said assembly of magnetic material within a spatial extent substantially smaller than said adjacent surface of said assembly of magnetic material, said flux concentrator means and said support sandwiching said assembly of magnetic material therebetween and said flux concentrator means defining a scanning area within said spatial extent wherein lines of magnetic flux are substantially parallel.

28. The NMR scanner apparatus according to claim 27 wherein said flux concentrator means exhibits a tee-shaped cross-section having a wider portion and a narrower portion, said wider portion being adjacent to said surface of said assembly of magnetic material and said narrower portion defining said spatial extent and said scanning area.

29. The NMR scanner apparatus according to claim 27 additionally comprising pole piece means for receiving flux from said flux concentrator means and providing said flux to said scanning area.

30. The NMR scanner apparatus according to claim 28 additionally comprising pole piece means for receiving flux from said flux concentrator means and providing said flux to said scanning area.

31. The NMR scanner apparatus according to claim 27 additionally comprising a plurality of magnetic means arranged to effect shielding.

32. The NMR scanner apparatus according to claim 31 wherein said assembly of magnetic material and said flux concentrator means form an interface therebetween and said plurality of magnetic means are disposed adjacent to said interface and said plurality of magnetic means are oppositely poled with respect to said assembly of magnetic material at said interface.

33. The NMR scanner apparatus according to claim 31 wherein said plurality of magnetic means are disposed adjacent portions of said flux concentrator means opposite to said assembly of magnetic material and exhibit an opposite polarity with respect thereto.

34. The NMR scanner apparatus according to claim 31 wherein said plurality of magnetic means comprise first and second groups of magnets, and wherein said flux concentrator means includes first and second opposed surfaces, said first surface being disposed adjacent to said assembly of magnetic material to form an interface therebetween and said second second surface being displaced from said assembly of magnetic material, said first group of magnets being disposed adjacent to said interface between said assembly of magnetic material and said first surface of said flux concentrator means and said second group of magnets being disposed adjacent portions of said second surface of said flux concentrator means opposite to said assembly of magnetic material, said first and second groups of magnets exhibiting opposite polarity with respect to portions of said assembly of magnetic material proximate thereto.

35. The NMR scanner apparatus according to claim 28 additionally comprising a plurality of magnetic means arranged to effect shielding.

36. The NMR scanner apparatus according to claim 35 wherein said assembly of magnetic material and said wider portion of said flux concentrator means form an interface therebetween and said plurality of magnetic means are disposed adjacent to said interface, said plurality of magnetic means being oppositely poled with respect to said assembly of magnetic material at said interface.

37. The NMR scanner apparatus according to claim 35 wherein said plurality of magnetic means are disposed adjacent portions of said flux concentrator means opposite to said assembly of magnetic material and exhibit an opposite polarity with respect thereto.

38. The NMR scanner apparatus according to claim 35 wherein said plurality of magnetic means comprise first and second groups of magnets and wherein said wider portion of said flux concentrator means includes first and second opposed surfaces, said first opposed surface being disposed adjacent said assembly of magnetic material to form an interface therebetween and said second opposed surface being spaced from said assembly of magnetic material, said first group of magnets being disposed adjacent to said interface between said assembly of magnetic material and said first surface of said flux concentrator means and said second group of magnets being disposed adjacent portions of said second surface of said flux concentrator means opposite to said assembly of magnetic material, said first and second groups of magnets exhibiting opposite polarity with respect to portions of said assembly of magnetic material proximate thereto.

39. The NMR scanner apparatus according to claim 27 wherein said assembly of magnetic material comprises an assembly of relatively low energy magnetic material; and wherein said NMR scanner apparatus additionally includes an assembly of relatively high energy magnetic material disposed adjacent to at least a portion of said flux concentrator means, said assembly of relatively high energy magnetic material exhibiting a smaller volume than said assembly of relatively low energy magnetic material, said portion of said flux concentrator means being disposed between said assembly of relatively low energy magnetic material and said assembly of relatively high energy magnetic material; and pole piece means disposed adjacent to said assembly of relatively high energy magnetic material, said pole piece means and said portion of said flux concentrator means having said assembly of relatively high energy magnetic material disposed therebetween.

40. The apparatus according to claim 39 additionally comprising means for completing a flux path for said primary magnetic field between said pole piece means and said support.

41. NMR scanner apparatus comprising:
a support formed of magnetically soft material;
an assembly of magnetic material disposed adjacent to said support and extending therefrom; and
flux concentrator means disposed adjacent to a surface of said assembly of magnetic material for concentrating flux generated by said assembly of magnetic material within a spatial extent substantially smaller than said adjacent surface of said assembly of magnetic material, said flux concentrator means and said support sandwiching said assembly of magnetic material therebetween and said flux concentrator means exhibiting a T-shaped cross section having a wider portion and a narrower portion, said wider portion being adjacent to said surface of said assembly of magnetic material and said narrower portion defining said spatial extent and a scanning area within said spatial extent wherein lines of magnetic flux are substantially parallel.

42. The NMR scanner apparatus according to claim 41 additionally comprising pole piece means for receiving flux from said flux concentrator means and providing said flux to said scanning area.

43. The NMR scanner apparatus according to claim 41 additionally comprising a plurality of magnetic means arranged to effect shielding.

44. The NMR scanner apparatus according to claim 43 wherein said plurality of magnetic means are disposed adjacent said wider portion of said flux concentrator means and are oppositely poled with respect to said assembly of magnetic material.

45. The NMR scanner apparatus according to claim 43 wherein said assembly of magnetic material and said wider portion of said flux concentrator means form an interface therebetween and said plurality of magnetic means are disposed adjacent to said interface and said plurality of magnetic means are oppositely poled with respect to said assembly of magnetic material at said interface.

46. The NMR scanner apparatus to claim 43 wherein said plurality of magnetic means comprise first and second groups of magnets and wherein said wider portion of said flux concentrator means includes first and second opposed surfaces, said first opposed surface being disposed adjacent said assembly of magnetic material to form an interface therebetween and said second opposed surface being spaced from said assembly of magnetic material, said first group of magnets being disposed adjacent to said interface between said assembly of magnetic material and said first surface of said flux concentrator means and said second group of magnets being disposed adjacent portions of said second surface of said flux concentrator means opposite to said assembly of magnetic material, said first and second groups of magnets exhibiting opposite polarity with respect to portions of said assembly of magnetic material proximate thereto.

47. The NMR scanner apparatus according to claim 43 additionally comprising pole piece means for receiving flux from said flux concentrator means and providing said flux to said scanning area.

48. The NMR scanner apparatus according to claim 41 wherein said assembly of magnetic material comprises an assembly of relatively low energy magnetic material; and wherein said NMR scanner apparatus additionally includes an assembly of relatively high energy magnetic material disposed adjacent to at least a part of said narrower portion of said flux concentrator means, said part of said flux concentrator means being disposed between said assembly of relatively low energy magnetic material and said assembly of relatively high energy magnetic material, said assembly of relatively high energy magnetic material having a lesser volume than said assembly of relatively low energy magnetic material; and pole piece means disposed adjacent to said assembly of relatively high energy magnetic material, said pole piece means and said part of said flux concentrator means having said assembly of relatively high energy magnetic material disposed therebetween.

49. The apparatus according to claim 48 additionally comprising means for completing a flux path through an air gap for said primary magnetic field from said pole piece means to said assembly of relatively low energy magnetic material.

50. The NMR scanner apparatus according to claim 41 wherein said assembly of magnetic material comprises an assembly of relatively low energy magnetic material having a sufficient volume to establish a predetermined base level energy for a primary magnetic field, and wherein said NMR scanner apparatus further includes an assembly of relatively high energy magnetic material adjacent to at least a part of said narrower portion of said flux concentrator means, said assembly of relatively high energy magnetic material having a volume which is less than the volume of said assembly of low energy magnetic material and is sufficient to substantially increase the energy for said primary magnetic field from said predetermined base level; and pole piece means disposed adjacent to said assembly of relatively high energy magnetic material, said pole piece means and said part of said flux concentrator means having said high energy magnetic material disposed therebetween.

51. The apparatus according to claim 50 additionally comprising means for completing a flux path through an air gap for said primary magnetic field from said pole piece means to said assembly of relatively low energy magnetic material.

52. NMR scanner apparatus comprising:
a support formed of magnetically soft material;
first and second assemblies of magnetic material disposed adjacent to said support and extending therefrom to define a gap therebetween;
first and second flux concentrator means disposed, respectively, adjacent to a surface of said first and second assemblies of magnetic material, said first flux concentrator means and said support acting to sandwich said first assembly of magnetic material therebetween and said second flux concentrator means and said support acting to sandwich said second assembly of magnetic material therebetween, said first and second flux concentrator means concentrating respectively flux generated by said first and second assemblies of magnetic within a predetermined spatial extent of said gap, said predetermined spatial extent being substantially smaller than said adjacent surfaces of said first and second assemblies of magnetic material and said first and second flux concentrator means each exhibiting a T-shaped cross section having a wider portion and a narrower portion, said wider portions being adjacent to said surfaces of said first and second assemblies of said magnetic material and said narrower portions defining said spatial extent therebetween and also defining a scanning area within said spatial extent in said gap between said narrower portions wherein lines of magnetic flus are substantially parallel.

53. The NMR scanner apparatus according to claim 52 additionally comprising first and second pole piece means for receiving, respectively, flux from said first and second flux concentrator means and providing said flux to said scanning area.

54. The NMR scanner apparatus according to claim 52 additionally comprising a plurality of magnetic means arranged to effect shielding.

55. The NMR scanner apparatus according to claim 52 wherein said first and second assemblies of magnetic material and said first and second flux concentrator means form an interface therebetween and said plurality of magnetic means are disposed adjacent to said interface and said plurality of magnetic means are oppositely poled with respect to said assembly of magnetic material at said interface.

56. The NMR scanner apparatus according to claim 52 wherein said plurality of magnetic means are disposed adjacent said wider portions of said first and second flux concentrator means and are oppositely poled with respect to respective portions of said first and second assemblies of magnetic material.

57. NMR scanner apparatus comprising:
a support formed of magnetically soft material;
an assembly of magnetic material disposed adjacent to said support and extending therefrom; and
flux conducting means disposed adjacent to a surface of said assembly of magnetic material for conducting flux generated by said assembly of magnetic material within a spatial extent smaller than said adjacent surface of said assembly of magnetic material, said flux conducting means and said support sandwiching said assembly of magnetic material therebetween and said flux conducting means exhibiting a T-shaped cross section having a wider portion and a narrower portion, said wider portion being adjacent to said surface of said assembly of magnetic material and said narrower portion defining a scanning area within said spatial extent wherein lines of magnetic flux are substantially parallel and uniform and of sufficient strength for imaging.

58. An NMR scanner apparatus comprising:
a support formed of magnetically soft material;
an assembly of relatively low energy magnetic material disposed adjacent to said support and extending therefrom;
flux concentrator means disposed adjacent to a surface of said assembly of magnetic material for concentrating flux generated by said assembly of magnetic material within a spatial extent smaller than said adjacent surface of said assembly of magnetic material, said flux concentrator means and said support sandwiching said assembly of relatively low energy magnetic material therebetween;
an assembly of relatively high energy magnetic material disposed adjacent to at least a portion of said flux concentrator means, said portion of said flux concentrator means being disposed between said assembly of relatively low energy magnetic material and said assembly of relatively high energy magnetic material, and said assembly of relatively high energy magnetic material having a lesser volume than said assembly of relatively low energy magnetic material;
and pole piece means disposed adjacent to said assembly of relatively high energy magnetic material, said pole piece means and said portion of said flux concentrator means having said assembly of relatively high energy magnetic material disposed therebetween, and said pole piece means defining a scanning area within said spatial extent wherein lines of magnetic flux are substantially parallel.

59. NMR scanner apparatus comprising:
an assembly of magnetic material formed of a substantial number of magnetic elements arranged in columns and rows of like polarity, said assembly of magnetic material defining a volume exhibiting sufficient coercivity to induce polarization in living tissue;
a support formed of magnetically soft material, said support providing a flux path for said assembly of magnetic material and a platform from which said assembly of magnetic material extends;
flux concentrator means disposed adjacent to a surface of said assembly of magnetic material for concentrating flux generated by said assembly of magnetic material through said flux concentrator means, said flux concentrator means and said support sandwiching said assembly of magnetic material therebetween, and said flux concentrator means including pole piece means spaced from said surface of said assembly of magnetic material for defining a scanning area adjacent said pole piece means wherein lines of magnetic flux are substantially parallel, said pole piece means receiving flux concentrated through said flux concentrator means and providing said flux to said scanning area.

60. In a nuclear magnetic resonance scanning and imaging apparatus of the type having a means for producing a primary magnetic field in a scanning volume of sufficient size to obtain an image of a portion of a human, the improvement wherein said means for producing said primary magnetic field comprises:
a frame of magnetically soft material having an opening therein of sufficient size to accommodate a human;
magnetic field producing means within said opening of said frame for producing a magnetic field; and
flux concentrator means of magnetically soft material positioned in said opening of said frame, said flux concentrator means including first and second opposed pole pieces of magnetically soft material spaced from one another to define an air gap therebetween of sufficient size for positioning a human therein, said flux concentrator means being arranged with respect to said magnetic field producing means and said frame so that magnetic flux produced by said magnetic field producing means is received by and concentrated through said flux concentrator means so as to be directed to said pole pieces, said first and second pole pieces being of a size and shape and so positioned that they produce substantially parallel lines or magnetic flux in a volume in said air gap of sufficient size to image a portion of a human positioned in said air gap, and said frame cooperating with said flux concentrator means to provide a return flux path for said magnetic flux provided to said air gap, whereby said volume having said substantially parallel lines of magnetic flux forms said scanning volume of said nuclear magnetic resonance scanning and imaging apparatus.

61. The nuclear magnetic resonance scanning and imaging apparatus of claim 60 wherein said magnetic field producing means comprises first and second magnetic field sources within said opening, said first magnetic field source being disposed adjacent to a first portion of said frame and said second magnetic field source being disposed adjacent a second portion of said frame; wherein said flux concentrator means comprises first and second flux concentrator members, said first flux concentrator member including said first pole piece and being positioned within said opening of said frame so that said first magnetic field source is between said first portion of said frame and said first pole piece. and said second flux concentrator member including said second pole piece and being positioned within said opening of said frame so that second magnetic field source is between said second portion of said frame and said second pole piece; and wherein the polarity of said first and second magnetic field sources is such that the magnetic flux provided to said air gap from said first magnetic field source is added to the magnetic flux provided to said air gap from said second magnetic field source.

62. The nuclear magnetic resonance scanning and imaging apparatus of claim 61 wherein said first flux concentrator member includes a first portion adjacent to said first magnetic field source and a second portion extending beyond said first magnetic field source away from said first portion of said frame, and wherein said second flux concentrator member includes a first portion adjacent to said second magnetic field source and a second portion extending beyond said second magnetic field source away from said second portion of said frame, said second portions of said first and second flux concentrator members including said first and second pole pieces respectively.

63. The nuclear magnetic resonance scanning and imaging apparatus of claim 62 wherein said first and second portions of said frame are spaced from one another, and wherein said frame includes connecting portions of magnetically soft material connecting said first and second portions of said frame, whereby said return flux path is provided through said connecting portions.

64. The nuclear magnetic resonance scanning and imaging apparatus of claim 62 wherein said second portions of said first and second flux concentrator members each have a spatial extent smaller than said first portions of said first and second flux concentrator members.

65. The nuclear magnetic resonance scanning and imaging apparatus of claim 60 wherein said frame is constructed so that a human can be moved into said air gap between said first and second pole pieces along a direction which is transverse to the direction of said substantially parallel lines of magnetic flux in said air gap.

66. The nuclear magnetic resonance scanning and imaging apparatus of claim 65 wherein said first and second pole pieces are spaced apart a distance sufficient so as to enable a human to be moved between said pole pieces, and are of a size and shape and so positioned that the transverse spatial extent of the said volume having said substantially parallel lines of magnetic flux is at least 10 inches.

67. The nuclear magnetic resonance scanning and imaging apparatus of claim 66 wherein said pole pieces are of a size and shape and so positioned that the magnetic field provided in said volume having said substantially parallel lines of magnetic flux has a flatness of better than one part in $10^3$.

68. The nuclear magnetic resonance scanning and imaging apparatus of claim 60 wherein said magnetic field producing means comprises an assembly of magnetic material supported from said frame and extending into said opening of said frame.

69. The nuclear magnetic resonance scanning and imaging apparatus of claim 68 wherein said assembly of magnetic material comprises an assembly of relatively low energy magnetic material, and wherein said flux concentrator means and said frame sandwich said assembly of relatively low energy magnetic material therebetween.

70. The nuclear magnetic resonance scanning and imaging apparatus of claim 68 wherein said assembly of magnetic material includes a first assembly of relatively low energy magnetic material and a second assembly of relatively high energy magnetic material, said second assembly of relatively high energy magnetic material having a smaller volume than said first assembly of relatively low energy magnetic material; wherein said flux concentrator means includes a first portion which is disposed adjacent to said first assembly of relatively low energy magnetic material and sandwiches said first assembly of relatively low energy magnetic material between said first portion and said frame, a second portion which is disposed between said first assembly of relatively low energy magnetic material and said second assembly of relatively high energy magnetic material, and a third portion which includes one of said pole pieces and sandwiches said assembly of relatively high energy magnetic material between said third portion and said second portion of said flux concentrator means.

71. The nuclear magnetic resonance scanning and imaging apparatus of claim 68 wherein said flux concentrator means has a cross-section which incluces a wide portion adjacent to a surface of said assembly of said magnetic material and a narrow portion spaced therefrom for concentrating flux generated by said assembly of magnetic material through said flux concentrator means from said wide portion towards said narrow portion, and wherein said narrow portion of said flux concentrator means includes said pole pieces.

72. A method for scanning and imaging of humans using nuclear magnetic resonance techniques, comprising:

providing an NMR scanning and imaging apparatus operable to subject biological tissue ro a primary magnetic field and simultaneously to an RF field to generate NMR signals and to detect and process said NMR signals to provide an image, said NMR scanning and imaging apparatus including means for producing a primary magnetic field comprised of (i) a frame of magnetically soft material having an opening therein of sufficient size to accommodate a human, (ii) magnetic field producing means within said opening of said frame for producing a magnetic field, and (iii) flux concentrator means of magnetically soft material positioned in said opening of said frame, said flux concentrator means including first and second opposed pole pieces of magnetically soft material spaced from one another to define an air gap therebetween of sufficient side for positioning a human therein, said flux concentrator means being arranged with respect to said magnetic field producing means and said frame so that magnetic flux produced by said magnetic field producing means is received by and concentrated through said flux concentrator means so as to be directed to said pole pieces, said first and second pole pieces being of a size and shape and so positioned that they produce substantially parallel lines of magnetic flux in a scanning volume in said air gap of sufficient size to image a portion of a human positioned in said air gap, and said frame cooperating with said flux concentrator means to provide a return flux path for said magnetic flux provided to said air gap;

positioning a human in said air gap between said first and second pole pieces so that a portion of said human is arranged in said scanning volume; and operating said NMR scanning and imaging apparatus so as to subject said portion of said human in said scanning volume to said primary magnetic field and simultaneously to said RF field to produce NMR signals from said portion of said human, and to then detect said produced NMR signals and process said NMR signals to provide an NMR image of said portion of said human.

73. The method of claim 72 wherein said step of positioning a human in said NMR scanning and positioning apparatus comprises moving said human into said air gap in a direction which is transverse to the direction of said substantially, parallel lines of magnetic flux.

74. The method of claim 73 wherein said first and second pole pieces of said provided NMR scanning and imaging apparatus are spaced apart a distance sufficient so as to enable a human to be moved between said pole pieces, and are of a size and shape and so positioned that the transverse spatial extent of the said scanning volume having said substantially parallel lines of magnetic flux is at least 10 inches.

75. The method of claim 74 wherein said pole pieces are of a size and shape and so positioned that the magnetic field produced in said scanning volume of said provided NMR scanning and imaging apparatus has a flatness of better than one part in $10^3$.

76. The method of claim 72 wherein said magnetic field producing means of said provided NMR scanning and imaging apparatus comprises first and second magnetic field sources within said opening, said first magnetic field source being disposed adjacent to a first portion of said frame and said second magnetic field source being disposed adjacent a second portion of said frame; wherein said flux concentrator means comprises first and second flux concentrator members, said first flux concentrator member including said first pole piece and being positioned within said opening of said frame so that said first magnetic field source is between said first portion of said frame and said first pole piece, and said second flux concentrator member including said second pole piece and being positioned within said opening of said frame so that said second magnetic field source is between said second portion of said frame and said second pole piece; and wherein the polarity of said first and second magnetic field source is such that the magnetic flux provided to said air gap from said first magnetic field source is added to the magnetic flux provided to said air gap from said second magnetic field source.

77. The method of claim 76 wherein said first flux concentrator member includes a first portion adjacent to said first magnetic field source and a second portion extending beyond said first magnetic field source away from said first portion of said frame, and wherein said second flux concentrator member includes a first portion adjacent to said second magnetic field source and a second portion extending beyond said second magnetic field source away from said second portion of said frame, said second portions of said first and second flux concentrator members including said first and second pole pieces respectively.

78. The method of claim 77 wherein said first and second portions of said frame are spaced from one another, and wherein said frame includes connecting portions of magnetically soft material connecting said first and second portions of said frame, whereby said return flux path is provided through said connecting portions.

79. The method of claim 77 wherein said second portions of said first and second flux concentrator members each have a spatial extent smaller than said first portion of said first and second flux concentrator members.

80. The method of claim 72 wherein said magnetic field producing means of said provided NMR scanning and imaging apparatus comprises an assembly of magnetic material supported from said frame and extending into said opening of said frame.

81. The method of claim 80 wherein said assembly of magnetic material comprises an assembly of relatively low energy magnetic material, and wherein said flux concentrator means and said frame sandwich said assembly of relatively low energy magnetic material therebetween.

82. The method of claim 80 wherein said assembly of magnetic material includes a first assembly of relatively low energy magnetic material and a second assembly of relatively high energy magnetic material, said second assembly of relatively high energy magnetic material having a smaller volume than said first assembly of relatively low energy magnetic material; wherein said flux concentrator means includes a first portion which is disposed adjacent to said first assembly of relatively low energy magnetic material and sandwiches said first assembly of relatively low energy magnetic material between said first portion and said frame, a second portion which is disposed between said first assembly of relatively low energy magnetic material and said second assembly of relatively high energy magnetic material, and a third portion which includes one of said pole pieces and sandwiches said assembly of relatively high energy magnetic material between said third portion and said second portion of said flux concentrator means.

83. The method of claim 80 wherein said flux concentrator means has a cross-section which includes a wide portion adjacent to a surface of said assembly of said magnetic material and a narrow portion spaced therefrom for concentrating flux generated by said assembly of magnetic material through said flux concentrator means from said wide portion towards said narrow portion, and wherein said narrow portion of said flux concentrator means includes said pole pieces.

* * * * *

UNITED STATES PATENT AND TRADEMARK OFFICE
CERTIFICATE OF CORRECTION

PATENT NO. : 4,675,609

DATED : June 23, 1987

INVENTOR(S) : Danby et al.

It is certified that error appears in the above-identified patent and that said Letters Patent is hereby corrected as shown below:

```
Column 5,  line 31, after "FIG. 1", insert --is--.
           line 63, after "and", insert --3--.
Column 6,  lines 45-46, delete lines 45-46.
           line 47, delete "netic."
Column 7,  line 3, delete "30".
           line 7, delete "35".
Column 12, line 11, "adjaccnt" should read --adjacent--.
           line 12, "potrion" should read --portion--.
           line 35, delete "!or" and insert therefor --for--.
           line 43, "relaitvely" should read --relatively--.
Column 13, lines 12-13, "dis-poscd" should read --disposed--.
           line 23, "assembl!ies" should read --assemblies--.
Column 14, line 1, "!o" should read --to--.
Column 17, line 8, after "magnetic", insert --material--.
```

Signed and Sealed this

Twenty-ninth Day of December, 1987

Attest:

DONALD J. QUIGG

Attesting Officer      Commissioner of Patents and Trademarks